United States Patent
Beaulaton et al.

(10) Patent No.: US 9,644,965 B2
(45) Date of Patent: May 9, 2017

(54) SYSTEM COMPRISING A MECHANICAL RESONATOR AND METHOD THEREFOR

(71) Applicants: Hugues Beaulaton, Toulouse (FR);
Thierry Cassagnes, Tournefeuille (FR);
Laurent Cornibert, Toulouse (FR);
Volker Wahl, Toulouse (FR)

(72) Inventors: Hugues Beaulaton, Toulouse (FR);
Thierry Cassagnes, Tournefeuille (FR);
Laurent Cornibert, Toulouse (FR);
Volker Wahl, Toulouse (FR)

(73) Assignee: NXP USA, Inc., Austin, TX (US)

( * ) Notice: Subject to any disclaimer, the term of this patent is extended or adjusted under 35 U.S.C. 154(b) by 325 days.

(21) Appl. No.: 14/642,202

(22) Filed: Mar. 9, 2015

(65) Prior Publication Data

US 2016/0102979 A1   Apr. 14, 2016

(30) Foreign Application Priority Data

Oct. 9, 2014   (WO) .................. PCT/IB2014/002473

(51) Int. Cl.
*G01C 19/5776*   (2012.01)
*G01C 19/5726*   (2012.01)

(52) U.S. Cl.
CPC ..... *G01C 19/5776* (2013.01); *G01C 19/5726* (2013.01); *H03B 2200/0094* (2013.01)

(58) Field of Classification Search
CPC ............ G01C 19/5776; G01C 19/5726; H03B 2200/0094; B81B 2201/0242
See application file for complete search history.

(56) References Cited

U.S. PATENT DOCUMENTS

| | | | |
|---|---|---|---|
| 5,001,649 A * | 3/1991 | Lo ........................ | B06B 1/0207 310/316.01 |
| 6,585,338 B2 * | 7/2003 | Harris ................ | G01C 19/5607 331/154 |
| 7,592,878 B2 * | 9/2009 | Fagg ....................... | H03B 5/06 327/337 |
| 7,895,893 B2 | 3/2011 | Mayer-Wegelin et al. | |
| 9,118,334 B2 * | 8/2015 | Schlarmann .............. | H03L 3/00 |
| 9,448,071 B2 * | 9/2016 | Garbarino .......... | G01C 19/5762 |

FOREIGN PATENT DOCUMENTS

WO       02065055 A3      8/2002

* cited by examiner

*Primary Examiner* — Justin Olamit
(74) *Attorney, Agent, or Firm* — Charlene R. Jackson

(57) ABSTRACT

A system comprises a mechanical resonator; an analog circuit operably coupled to the mechanical resonator; the analog circuit arranged to receive a mechanical resonator measurement signal and to output a mechanical resonator actuation signal to the mechanical resonator; and a digital actuator operably coupled to the analog circuit and configured to provide a frequency sweep of signals to the analog circuit that induces movement of the mechanical resonator.

19 Claims, 7 Drawing Sheets

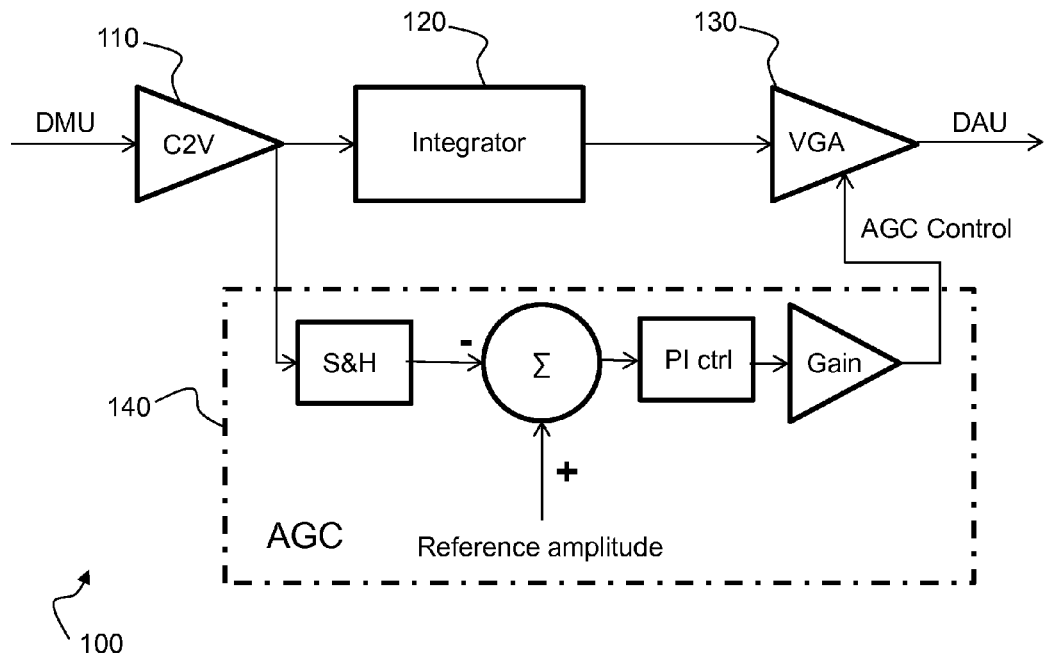
FIG. 1 – Prior art
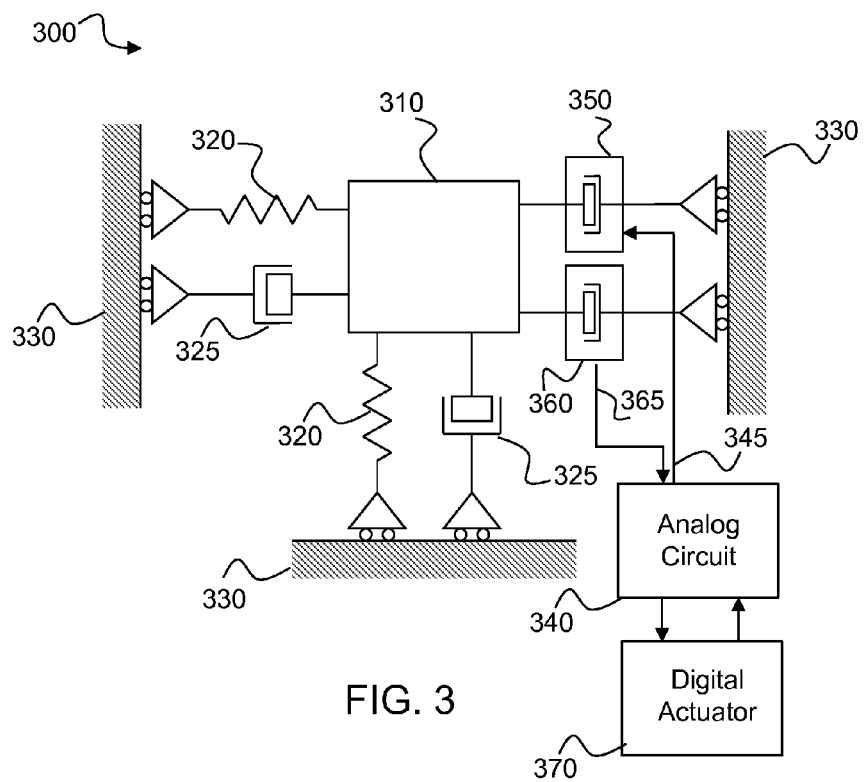
FIG. 3

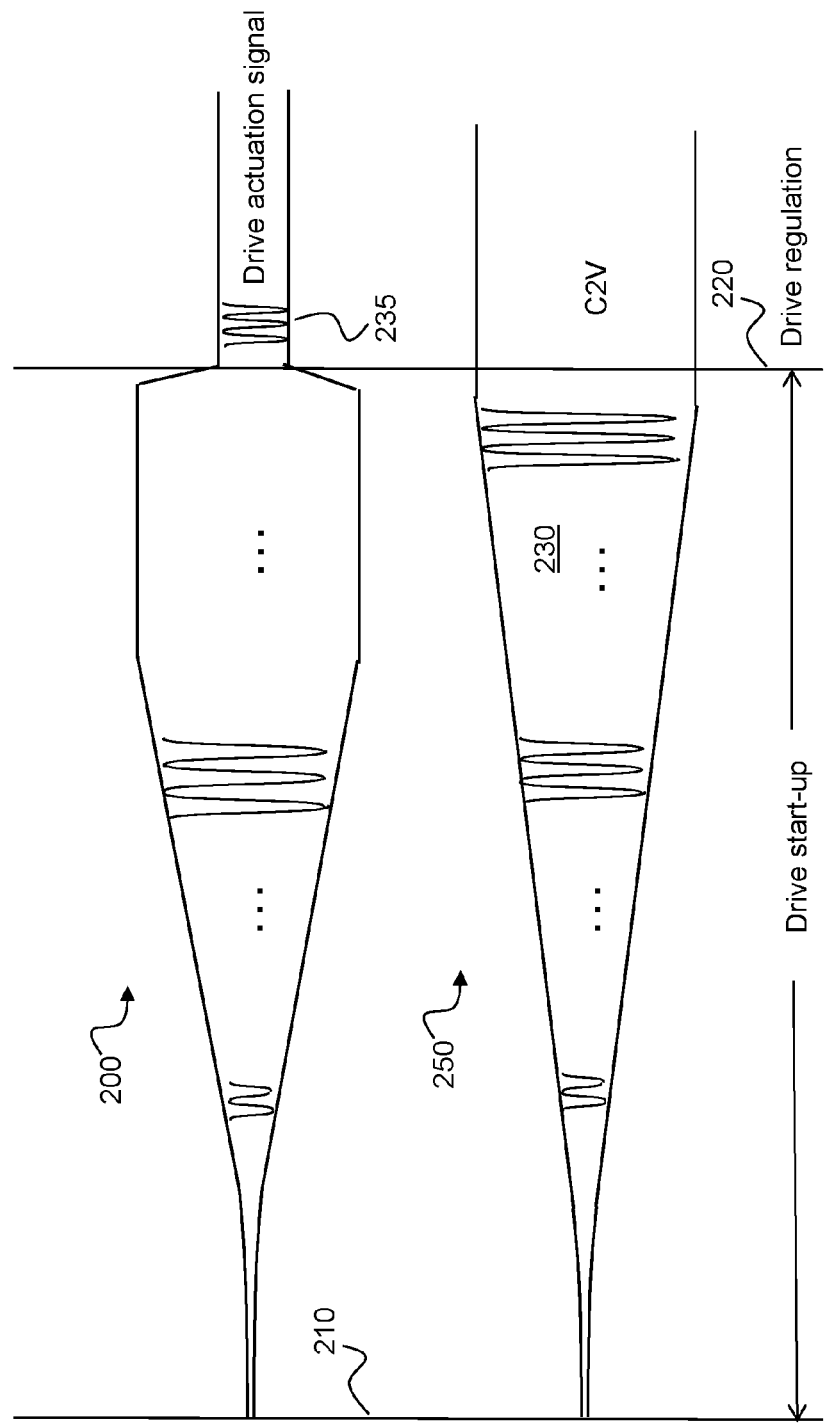
FIG. 2 – Prior art

SYSTEM COMPRISING A MECHANICAL RESONATOR AND METHOD THEREFOR

CROSS REFERENCE TO RELATED APPLICATION(S)

The present application claims priority to International Patent Application No. PCT/IB2014/002473, entitled "SYSTEM COMPRISING A MECHANICAL RESONATOR AND METHOD THEREFOR," filed on Oct. 9, 2014, the entirety of which is herein incorporated by reference.

FIELD OF THE INVENTION

The field of this invention relates to a mechanical resonator for use within a system, such as a micro-electromechanical-system (MEMS) device, and method therefor. The invention is applicable to, but not limited to, a mechanism for kick-starting a proof mass of a gyroscope.

BACKGROUND OF THE INVENTION

Vibrating micro-electro-mechanical-system (MEMS) gyroscopes are used in a variety of mechanical or electromechanical systems where an angular rotation rate is to be measured. A vibrating MEMS gyroscope comprises a gyroscope mass that is connected by springs to a substrate. The gyroscope mass is movable along a driving axis in resonant oscillation by the use of a drive force in order to provoke and maintain the movement. The drive force is supplied and controlled using a drive actuation unit and a drive measurement unit and associated circuitry. The drive actuation unit typically comprises a capacitive coupling along the driving axis between a capacitor plate on the substrate and an opposite capacitor plate on the movable gyroscope mass. A Coriolis force acting on the gyroscope mass may be induced as a capacitive force by applying a voltage to the capacitor plates of the drive actuation unit, whereby the gyroscope mass is moved. The drive measurement unit comprises, e.g., a similar pair of capacitor plates. The capacitance between the capacitor plates of the drive measurement unit is measured as a drive measurement signal and forms an indication of the displacement of the gyroscope mass along the driving axis.

A Coriolis force will apply to the gyroscope proof mass in the presence of an angular rotation. The Coriolis force Fc is proportional to the product of the proof-mass 'm', the input rate '$\Omega$', the proof mass velocity 'v', and its angular rate of rotation perpendicular to the direction of movement. The Coriolis force hereby results in a displacement of the gyroscope mass along a sensing axis perpendicular to the driving axis. Measurement of the displacement of the gyroscope mass along the sensing axis can be used to obtain a measure of the Coriolis force and thus a measure of the angular rate of rotation.

A sense measurement unit is sometimes provided, which, similar to the drive measurement unit, may comprise a capacitive coupling along the sensing axis between a sense capacitor plate on the substrate and an opposite sense capacitor plate on the movable gyroscope mass. The capacitance between the sense capacitor plates of the sense measurement unit is measured as a sense measurement signal and forms an indication of the displacement of the gyroscope mass along the sensing axis.

Thus, the basic architecture of a vibratory gyroscope is comprised of a drive-mode oscillator that generates and maintains a constant linear momentum of the proof-mass, and a sense mode circuit that measures the sinusoidal Coriolis force induced due to the combination of the drive oscillation and any angular rate input. Since the Coriolis Effect is based on conservation of momentum, the drive-mode oscillator circuit is implemented to provoke the oscillation of the proof-mass that is the source of this momentum.

FIG. 1 illustrates a simplified block diagram of such a drive-mode oscillator circuit 100 for a MEMS, which uses a simple analog control loop to control the MEMS proof-mass displacement. The analog loop applies an electrostatic force proportional to displacement. The drive-mode oscillator circuit 100 comprises a capacitance to voltage (C2V) converter 110 arranged to convert a capacitance change of a MEMS drive measurement unit (DMU) (not shown) caused by the displacement of the proof-mass to a voltage measurement signal. An integrator 120 receives the voltage measurement signal and phase shifts it by, 90° in order to compensate for the phase lag (mechanical pole) of the MEMS device. A voltage gain amplifier (VGA) 130 receives the phase shifted voltage signal and outputs an actuation voltage signal to a drive actuation unit (DAU) (not shown) of the MEMS device. An automatic gain control (AGC) circuit 140 provides a control signal to the VGA 130 in order to control the amplitude of the actuation voltage signal output thereby.

FIG. 2 illustrates a drive activation waveform 200 associated with FIG. 1. At start-up, since there is no displacement, the electrostatic force is null. Only the force generated by the noise may make the loop start. A system turn-on time is indicated at 210 and FIG. 2 illustrates the drive start-up time 265 that is required to reach the target MEMS displacement level. Due to the positive feedback of the drive loop in FIG. 1, the drive motion is amplified 230 until the target displacement is reached at 220. Thus, when a MEMS gyroscope is initially turned on, it takes a significant amount of time to achieve an oscillating displacement range for the proof-mass in order to obtain meaningful measurements. Thereafter, the AGC loop is arranged to reduce the drive actuation signal 235 in order to regulate the capacitance to voltage (C2V) level 250.

The start-up time for gyroscopes is a known weakness due to the need for the proof-mass motion to reach its natural (resonance) frequency from an inertia state. Furthermore, the natural (resonance) frequency of such a proof-mass is not known apriori, or indeed is it consistent between, say, gyroscopes, due to, inter alia, manufacturing and component tolerances, open-loop operation and interaction between, say, an electrical resistor-capacitor (RC) oscillator and the mechanical resonator. The start-up time for gyroscopes is also a known weakness due to the fact that the bandwidth of the mechanical resonator has to be small, and is therefore difficult to tune. In order to avoid start-up delays in the use of such MEMS gyroscopes, it is known to implement a 'standby mode' in which oscillation of the proof-mass is maintained by the drive-mode oscillator circuit, whilst the sensing circuit(s) is/are powered down to conserve power. However, maintaining such a standby mode of the drive-mode oscillator circuit requires the oscillator circuit to remain powered up. Furthermore, driving the proof-mass consumes a significant amount of power, which in many electronic applications is undesirable.

A further drawback of such a MEMS device is the high quality ('Q') factor (e.g. a 'Q' value of ~10,000) of the MEMS proof mass oscillation system. Such a 'Q' factor inherently provides a slow gain increase and therefore requires a long time in order to reach the correct amplitude of oscillation.

U.S. Pat. No. 7,895,893 B2, titled: "Method for operating a vibrating gyroscope and sensor", describes a vibrating gyroscope that uses a fixed frequency kick of a value of a natural frequency based on a previously measured value, in order to speed up the start-up time.

SUMMARY OF THE INVENTION

The present invention provides a system, such as a micro-electro-mechanical system, MEMS, device, an integrated circuit and a method of generating an actuation signal for a mechanical resonator therefor, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 1 illustrates a simplified block diagram of a drive mode oscillator circuit for a MEMS device.

FIG. 2 illustrates a drive activation and a capacitance to voltage (C2V) waveform associated with the drive mode oscillator circuit of FIG. 1, highlighting the system turn-on delay until the target MEMS displacement level is reached.

FIG. 3 illustrates a simplified block diagram of an example of a Micro-Electro-Mechanical System (MEMS) device.

DETAILED DESCRIPTION

Figure 4:
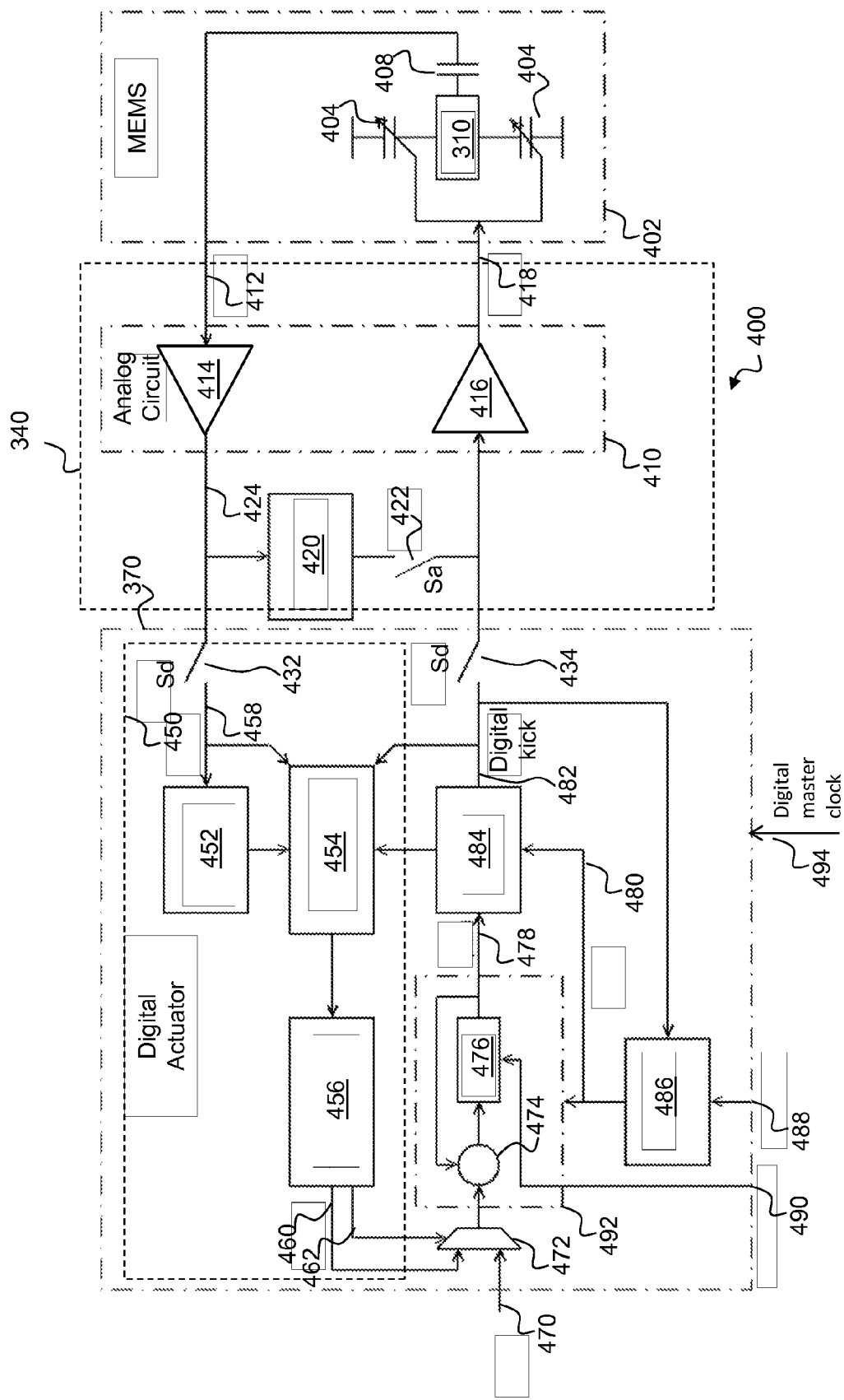
FIG. 4 illustrates a simplified block diagram of an example of a MEMS device employing a digital actuator.

The present invention will now be described with reference to the accompanying drawings. However, it will be appreciated that the present invention is not limited to the specific examples herein described and illustrated in the drawings. Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Although examples of the invention are described with reference to use with a MEMS device, the concepts herein described may be applied to any system or device employing a mechanical resonator, and are thus not limited to the specific components or circuits or architecture of FIG. 4.

In some examples, a digital actuator is introduced into a system employing a mechanical resonator, such as MEMS device employing a MEMS proof mass, whereby the digital actuator initiates the motion of the MEMS proof mass in an open loop mode of operation with a frequency sweep kick and then fine tunes the motion of the MEMS proof mass in a closed loop mode of operation.

In some examples, the mechanical resonator or MEMS proof mass may reside in an idle state and the digital actuator be configured to provide a kick start to the system upon turn on and prior to the mechanical resonator or proof mass leaving the idle state. In this manner, the start-up time may be reduced.

For clarity, the idle state also known as 'drive-running mode', 'standby mode', 'ready-mode', 'sleep-mode', may be considered to comprise, for example, an operating mode of the MEMS device in which oscillation of the proof-mass is maintained by an analog circuit, whilst one or more sensing circuit(s) (not shown) of the MEMS device may be powered down to conserve power. In this case, as the MEMS is in motion, the same signals are provided by the MEMS to the drive circuit than in active mode. However, in contrast, an 'active mode' may be considered to comprise, for example, an operating mode of the MEMS device when a Coriolis force applied to the proof-mass is required to be measured, or another similar measurement relating to the proof-mass is required to be measured.

In some examples, the digital actuator in an open loop configuration may generate and provide to the proof-mass a frequency sweep of pulses substantially around the targeted natural frequency of the proof-mass. In some examples, the frequency sweep of pulses may be kick started at a given frequency close to the MEMS natural frequency (either higher or lower) and sweep towards, and in some instances beyond, the MEMS natural frequency.

In some examples, the frequency sweep of pulses may be hard-coded. In some examples, an user set, for example a selection of options to trigger the actuation, may include one or more of: a number of pulses used, a start frequency of the frequency sweep (for example set at a half period of the pulses), a frequency step (which in some examples may be an integer number of the digital master clock period but a fractional number of the MEMS frequency) and therefore the frequency range if a number of pulses is set. According to the accuracy and frequency of the digital master clock, the accuracy of the mechanical process and the distribution of the MEMS frequency, the user set (or hard coded frequency sweep of pulses) may define the sweep start frequency and/or sweep stop frequency and/or the frequency sweep step in order to ensure that the frequency sweep crosses the MEMS natural frequency.

In some examples, the digital actuator may monitor a phase and frequency of the MEMS proof-mass from a generated digital stream of pulses and modulates the train of pulses. The digital actuator may change (e.g. increase or decrease and/or change the sign) the incremental step according to a determined phase, frequency or a combination of both. In this manner, the MEMS device turn-on process can be kick-started more effectively. By monitoring the phase and frequency of the mass movement, the MEMS device may be able to adapt the bit stream such that a maximum amount of electrical energy is transferred to motion.

Referring first to FIG. 3, there is illustrated a simplified block diagram of an example of a Micro-Electro-Mechanical System (MEMS) device 300. The MEMS device 300 comprises a vibratory proof-mass 310 suspended by springs 320 and dampened by pistons 325 above one or more substrate (s) 330. An analog circuit 340 generates an actuation signal 345, which drives a drive actuation unit (DAU) 350 of the MEMS device 300 to cause the proof-mass 310 to oscillate. The analog circuit is arranged to control the amplitude of signals and ensure a correct sign of such signals. A drive measurement unit (DMU) 360 of the MEMS device 300 outputs a proof-mass measurement signal 365 comprising an indication of a capacitance change therein caused by the displacement of the proof-mass 310. The proof-mass measurement signal 365 is provided as feedback to the analog circuit 340.

In accordance with examples of the invention, a digital actuator circuit 370 is operably coupled to the analog circuit 340 and arranged to generate and provide to the proof-mass a frequency sweep of pulses substantially around the targeted natural frequency of the proof-mass 310. In some examples, the digital actuator may be operating in an open loop configuration when providing to the proof-mass 310 a frequency sweep of pulses substantially around the targeted natural frequency of the proof-mass 310. In some examples, the digital actuator may then operate in a closed loop configuration to further adjust the frequency sweep of pulses to the natural frequency of the proof-mass 310. Such a provision of a frequency sweep of pulses substantially around the targeted natural frequency of the proof-mass 310 enables the drive activation signal to be reached much quicker, thereby reducing a start-up time following turn on of the MEMS device 300.

Referring now to FIG. 4, there is illustrated a simplified block diagram 400 of an example of a MEMS device 402 with a digital actuator 370 arranged to provide a configurable sweep kick start for a mechanical resonator. In some examples, the digital actuator 370 illustrated in FIG. 3 may be implemented within an integrated circuit 300 comprising at least one die within a single integrated circuit package.

In accordance with examples of the invention, the mechanical resonator system may enter a sleep mode or idle mode for a period of time. In order to hasten the start-up period from such a sleep mode or idle mode, a digital actuator circuit 370 is operably coupled to the analog circuit 340 and arranged to generate and provide to the mechanical resonator (or proof-mass 310 in the case of a MEMS device 300), a kick start frequency sweep of pulses substantially around the targeted natural frequency of the proof-mass 310. Such a provision of a frequency sweep of pulses, substantially around the targeted natural frequency of the proof-mass 310 enables the drive activation signal to be reached much quicker, thereby reducing a start-up time following turn on of the MEMS device 300.

MEMS in an Idle State, with System Performing an Open Loop Kick Start in Response to Turn on.

In order to apply a frequency sweep of pulses substantially around the targeted natural frequency of the proof-mass 310, in order to kick-start the proof mass resonance, the digital actuator 370, initially functions in an open loop mode of operation. In some examples, the digital actuator 370 and/or one or more components therein, may be configurable. In this open loop mode of operation example, switch Sd 434 is closed and switch Sa 422 is opened.

With the MEMS in an idle state, there is a MEMS clock 424 output from the analog circuit 410, which does not reach the digital actuator 370 due to switch Sd 432 being open. In an open loop mode of operation, the digital actuator 370 comprises a pulse frequency control circuit 492 comprising an accumulator 476 that is arranged to accumulate a frequency step size, which in some examples may be a user configured step size 470. In some examples, the values may be hard-coded to the frequency of the pulses around the natural resonance frequency of the proof mass as these may be known beforehand. In some examples, the step size may be coded in accordance with a digital master clock 494 (for example using an internal higher clock frequency, say, of 16 MHz). For instance:

if a ratio between the digital master clock 494 and the MEMS frequency is of the order of, say, 1000×, if the step size is, say, two periods of the digital master clock 494, if the start frequency is 1010×digital master clock period, and the start frequency is therefore lower than the MEMS frequency, since $f=1/t$, then the pulse stream will be at the same frequency than the MEMS after 5 periods of the MEMS (i.e. 1010−5×2=1000).

The accumulator 476 accumulates a frequency step value by feeding back its output to a summing junction 474 to be added to the next input frequency step, for example by accumulating at a multiple 1010, 1008, 1006, 1004 . . . of the digital master clock 494, for example the accumulator 476 registers:

Start_period−number_of_steps×step_size.

In some examples, the accumulator 476 may be triggered by a 'start_half_period' signal 490. Thus, instead of incrementing the period at each period (e.g. rising or falling edge of the MEMS mass), the period may be updated at both the rising and falling edge (hence at each half period of the MEMS proof-mass). In some examples, the period may be changed every set number, or adjustable number of periods, of the MEMS mass.

The output pulse frequency sweep provided by the accumulator 476 may be controlled by a pulse number counter 486 that increments at each kick (or pulse) provided to the MEMS 402. The pulse number counter 486 is the pulse counter that determines whether the pulse number (count) 488 has been reached, at which time it then stops incrementing the kick clock period counter 484 (and therefore the digital kick).

The accumulator 476 outputs an accumulated frequency step 478 that is added to a kick clock period counter 484, sometimes referred to as a half period counter, which measures a duration of the kick clock period according to the digital master clock 494 and provides a digital frequency sweep kick to the AGC 416. The kick clock period is enabled 480 by the pulse number counter 486. In this manner, the kick clock period counter 484 is incremented by the accumulated frequency step 478. The kick clock period counter 484 outputs a digital kick 482 (for example a 10 kHz clock independent of the Q clock of the MEMS) to the AGC 416 of the analog circuit 410.

When the pulse number 488 applied to the pulse number counter 486 reaches the desired number of pulses, the pulse counter 486 switches the digital actuator 370 from an open loop mode of operation to a closed loop mode of operation by opening the switches Sd 432, 434 and closing switch Sa 422 to allow the MEMS device to operate in a fine tuning closed loop mode of operation. In some examples, the digital closed loop mode of operation may be applied at the beginning of an operation (following, say, the first pulse) by closing switches Sd 432, 434, if the natural frequency of the mechanical resonator is quickly located.

In some examples, the number of pulses to be used may be system dependent and hard-coded, whereas in other systems the number of pulses may be configurable. In examples where the number of pulses to be used may be system dependent, the number of pulses used may be determined by means of system simulations to ensure an efficient trade-off between the frequency step size and the desired start-up time. For example, if the number of pulses is too low, not enough energy is transferred to the MEMS proof-mass 310 and the movement is insufficient to generate a MEMS clock (Qclk) suitable to run in the analog control closed loop (switch Sa 422 closes and switches 432 and 434 open). If the number of pluses is too high, since the digital actuator is less efficient than the analog loop once the MEMS clock (Qclk) is present, the start-up of the system may take longer.

MEMS in an Idle State, with the System Switching to a Closed Loop Mode of Operation.

In some examples, once the pulse number counter 486 reaches the desired number of pulses, the pulse counter 486 and the digital actuator 370 switches off and hands the operation over to the analog circuit loop 400. In a closed loop mode of operation, the digital actuator 370 comprises a MEMS clock period counter 452 that measures a duration of the MEMS (Q) clock 458 according to the digital master clock 494. In some examples, the digital master clock 494 may be employed as a time reference that is high enough to count the MEMS period. The higher the digital master clock 494, the higher the accuracy of the pulses versus the MEMS (Q) clock 458. In some examples, the digital master clock 494 may be at least 100 times the frequency of the MEMS (Q) clock 458.

The MEMS (Q) clock 458 and the output from the MEMS clock period counter 452 are input to a phase and frequency detector 454 that compares the frequency and phase outputs of the MEMS period counter 452 and kick clock period counter 484. The phase and frequency detector 454 also receives a clocked input from the kick clock period counter 484. The phase and frequency detector 454 outputs the comparison to a phase and frequency modulator 456 that, dependent upon the comparison, either: updates the step size via line 460, for example by inputting the updated step size to a multiplexer 472 that also receives the baseline user step size 470. In some examples, the source of the step size may be changed (between a hard coded version entered into, say, a one-time programmable memory or an adaptive version) using line 462, for example according to the type or character of system being employed. In another example, where only the sign of the step is swapped, line 460 may not be used with only a sign inverter at 470 being input to multiplexer 472, with line 462 being used to swap the sign.

If the comparison between both frequency and phase is below a pre-determined, e.g. hard-coded, level, this may mean that both frequency and phase are close together and that the system should remain as is because the maximum energy is being transferred to the MEMS proof-mass 310. In this example the frequency increment/decrement may be stopped at the multiplexer 472. In some examples, the phase and frequency detector 454 may additionally or alternatively, update the step sign, stop the kicking operation if the comparison between the MEMS period counter 452 and the kick clock period counter 484 is a match, or take any other action that improves the start-up time.

Once the phase and frequency modulator 456 determines that the clocked input from the kick clock period counter 484 is sufficiently close to the MEMS (Q) clock 458, i.e. the signals are in phase, then the frequency modulator 456 may halt the closed loop operation, e.g. stop the sweeping, and maintain the pulse at this sweep frequency via multiplexer control 462.

It will be appreciated that any suitable digital actuator and/or analog circuit arrangement may equally be implemented to perform the function of the configurable sweep kick start and/or analog circuit 410 for a mechanical resonator, such as the proof mass 310 of the MEMS device 402, and the examples herein described are not limited to the specific circuit arrangement illustrated in FIG. 4.

In some examples, in order to save silicon area, the various counters may be shared with other modules or counters within the system, since the counters used in the digital actuator may only be required for use at start-up and following an idle mode of operation. Thus, in some examples, the various counters may be used for different purposes when the MEMS drive loop is used for other purposes or is in an active mode of operation.

In some examples, the kick clock period counter 484 may be shared with a digital synthesizer. In this example, during the creation of a 'configurable' kick, an 'I' clock suitable for the demodulation may not be required to be independently generated, and instead generated by a digital phase shift of the 'Q' clock.

In some examples, the (analog) integrator or 90° phase shifter 420 may be replaced by a digital integrator.

Active Mode of Operation.

Thereafter, in an active mode of operation, an analog circuit 410 is arranged to receive a proof-mass measurement signal 412 from the DMU of the proof-mass 310 of the MEMS device 402, and to output a proof-mass actuation MEMS clock 424. The proof-mass measurement signal 412 comprises an indication of a capacitance change in the variable capacitance values associated with actuation electrodes 404 and capacitor 408 caused by the displacement of the proof-mass 310.

The analog circuit 410 comprises a capacitance to voltage (C2V) converter and comparator module 414 arranged to receive the proof-mass measurement signal 412 from the DMU and convert the indicated capacitance change of the DMU caused by the displacement of the proof-mass 310 to a clock from the MEMS 424.

In the illustrated example, the MEMS clock 424 that is output by the C2V converter and comparator module 414 is phase shifted by, for example, an integrator or 90° phase shifter 420 to compensate for the phase lead/lag of the MEMS device 400. In this manner, the phase shifter 420 outputs a phase shifted voltage signal that is routed to an automatic gain control (AGC) circuit 416 that controls the amplitude of the phase shifted MEMS clock 424 when switch (Sa) 422 is closed in order to control the amplitude of the actuation voltage signal output thereby. The output from the AGC 416 is a differential lock signal 418 that is provided to the actuation electrodes 404 of the MEMS device 402, which in some examples may be a differential sine wave around a common-mode voltage in order to actuate the actuation electrodes 404 in an opposite direction.

Figure 5:
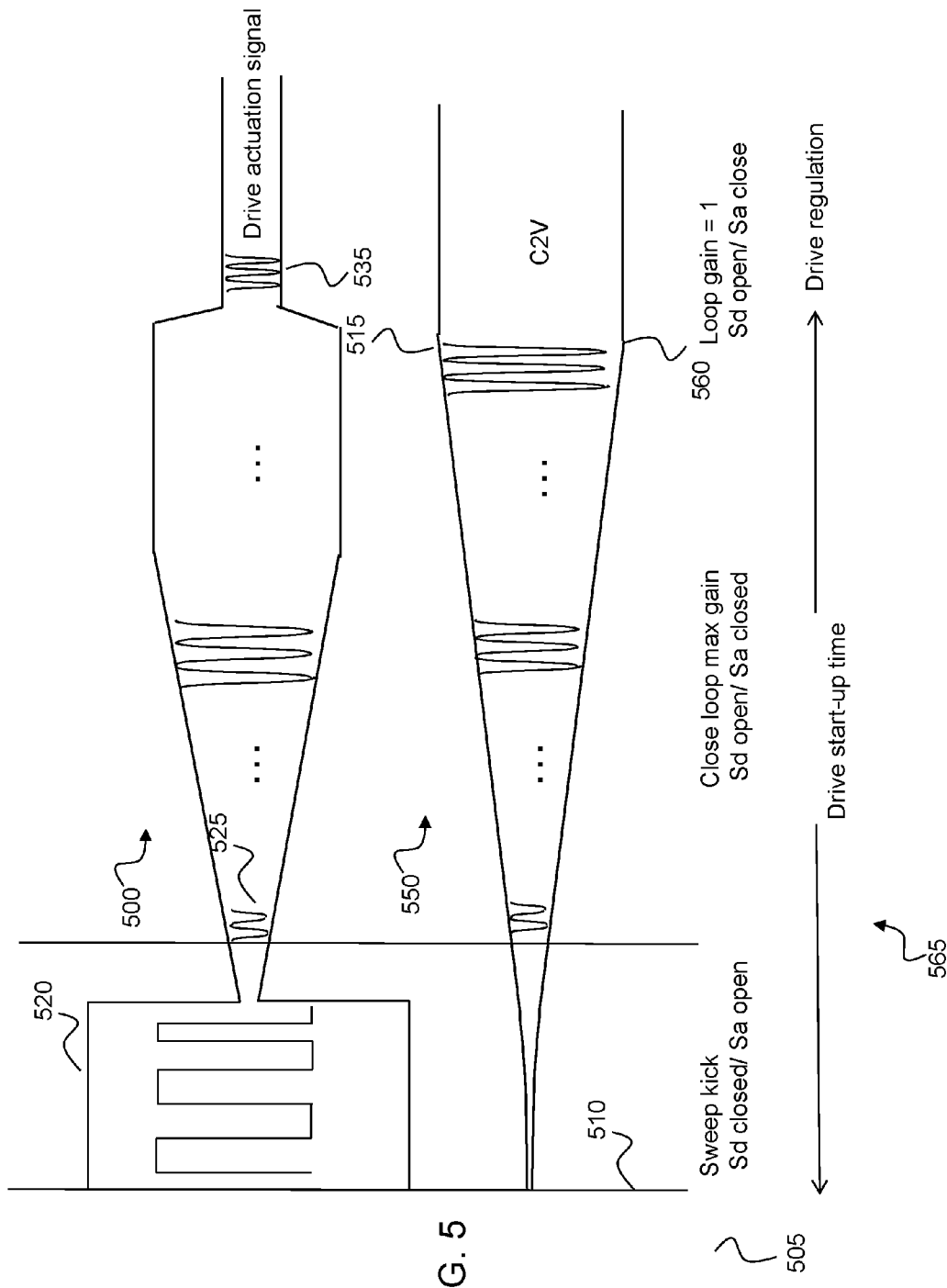
FIG. 5 illustrates an example drive activation and a capacitance to voltage (C2V) waveform for the MEMS device employing the digital actuator of FIG. 4.

FIG. 5 illustrates an example of a drive activation waveform 500 and a C2V waveform 550 for the MEMS device employing the digital actuator of FIG. 4. In contrast to the waveform of FIG. 2, following an idle time 505 and in response to turn on 510, the digital actuator initiates a configurable sweep kick start operation 520. As part of the digital actuator configurable sweep kick start operation 520, an initial open loop digital kick is generated, for example based on pre-configured values, with switches Sd 432, 434 closed and switch Sa 422 open in FIG. 4. Once the open loop digital frequency sweep kick start has been running for a number of pulses, the configurable sweep kick start operation 520 transfers to a closed loop mode of operation and switches 432, 434 are opened and switch Sa 422 closed in FIG. 4.

The configurable sweep kick start operation 520 ensures that there is early displacement 525 of the drive activation waveform 500. Furthermore, the drive start-up time 565 to reach the target MEMS displacement level 515, due to the configurable sweep kick start operation 520 and positive feedback of the drive loop, is noticeably less than for FIG. 2. Thus, with a MEMS gyroscope example, the start-up time is significantly less to achieve an oscillating displacement range for the proof-mass required for obtaining meaningful measurements. Thereafter, the AGC loop is arranged to reduce the drive actuation signal 535 in order to regulate the capacitance to voltage (C2V) level 560.

Figure 6:
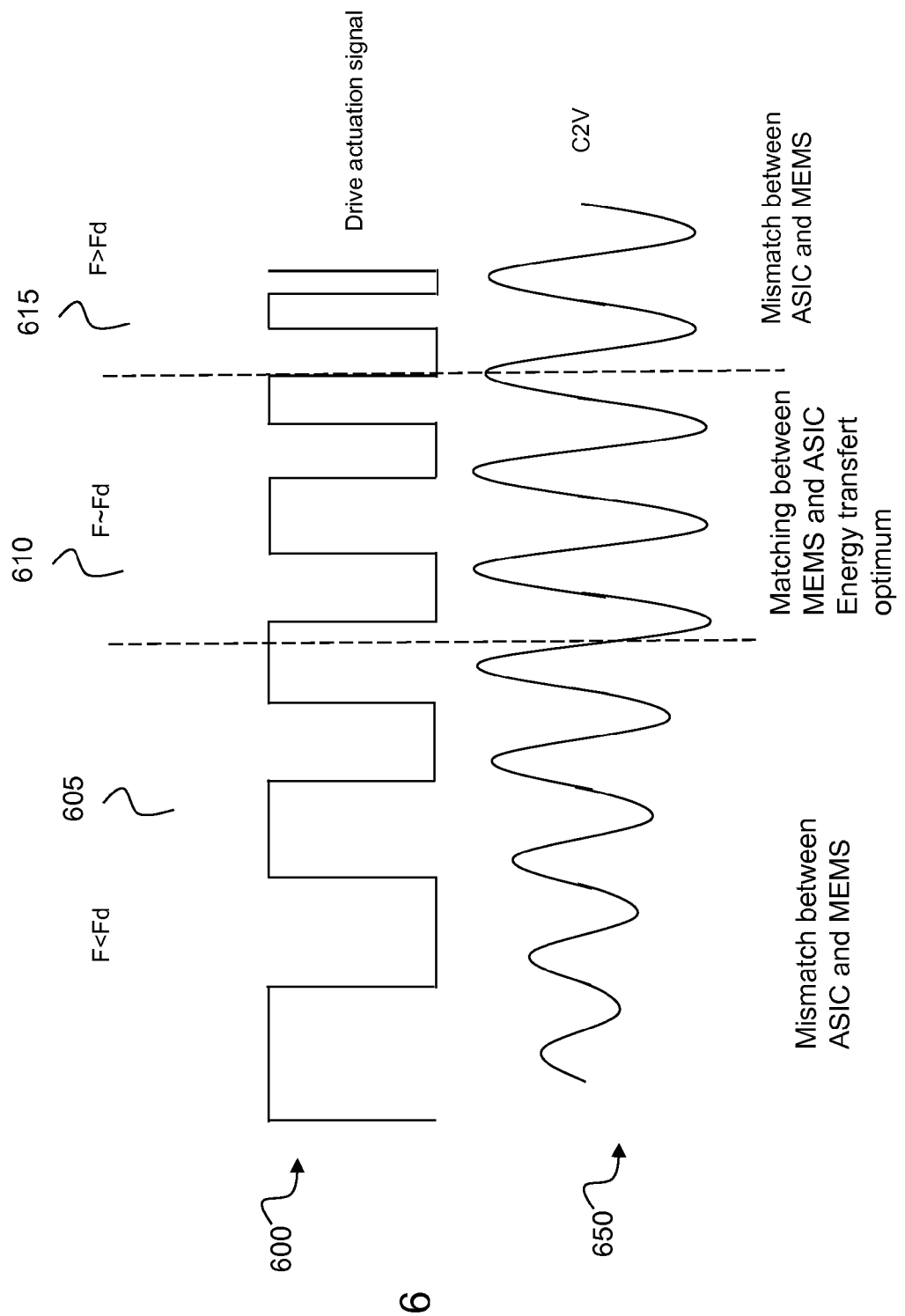
FIG. 6 illustrates an example of an open loop sweep kick operation around the resonance frequency for the MEMS device employing the digital actuator of FIG. 4.

FIG. 6 illustrates an example of an open loop sweep kick operation around the target resonance frequency of the proof mass of the MEMS device employing the digital actuator of FIG. 4. In this example, an open loop frequency sweep stimuli is applied to the MEMS actuation electrodes before the drive loop is closed at maximum gain. A drive activation waveform 600 and a C2V waveform 650 for the MEMS device employing a digital actuator of FIG. 4 are again shown. In one example, the waveforms are applied following an idle time and in response to a turn on of the MEMS device. The digital actuator output, following the open loop frequency sweep kick start operation, effectively activates the actuation electrodes and capacitor of the MEMS device and cause the displacement of the proof-mass 310. When the frequency (F) of the stimuli is less than the natural (resonance) frequency (Fd) of the proof mass of the MEMS device (i.e. F<Fd 605), or when the frequency (F) of the stimuli is greater than the natural (resonance) frequency (Fd) of the proof mass of the MEMS device (i.e. F>Fd 615), the energy transferred between the electronic circuit(s) and the MEMS mechanical circuit is mismatched and not at a maximum. In this example, such a mismatch may exist between the drive actuation signal 600 from the electronic circuit(s) and the output of the C2V waveform 650 that is a representation of the proof mass displacement of the MEMS device. However, when the frequency (F) of the stimuli is close to 610 the natural (resonance) frequency (Fd) of the proof mass of the MEMS device, the matched frequencies ensure that energy transferred between the ASIC and MEMS device is substantially at a maximum. In some examples, when employing such an open loop frequency sweep kick operation, the start-up time may be of the order of ~34% less than the start-up time of the MEMS device of FIG. 1, as illustrated in FIG. 2.

Figure 7:
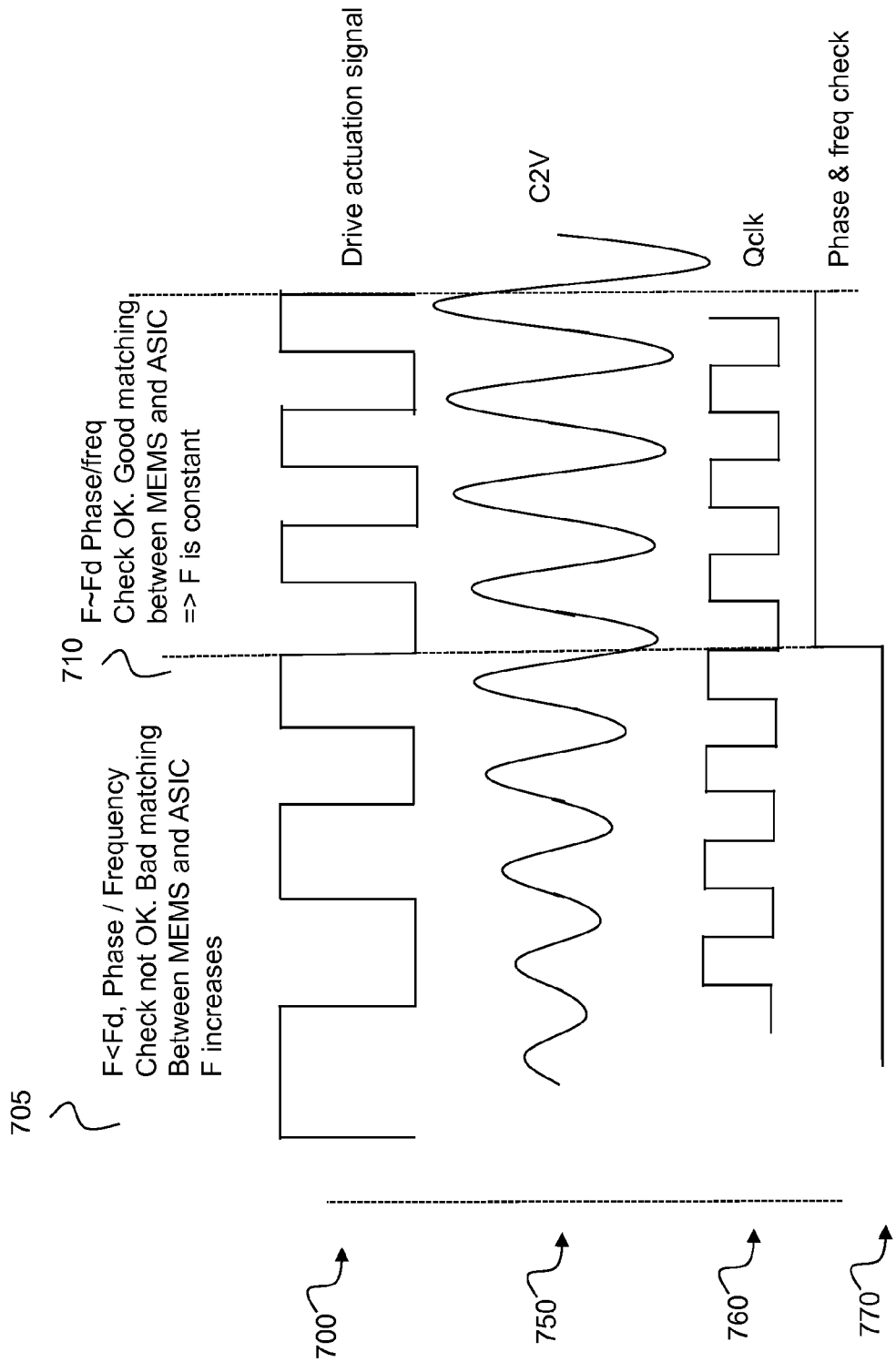
FIG. 7 illustrates an example of a subsequent closed loop sweep kick operation to fine tune to the resonance frequency for the MEMS device employing the digital actuator of FIG. 4.

FIG. 7 illustrates an example of a subsequent closed loop sweep kick operation around the target resonance frequency of the proof mass of the MEMS device employing the digital actuator of FIG. 4. In this example, a closed loop frequency sweep kick is applied to the MEMS actuation electrodes of FIG. 4. A drive activation waveform 700 and a C2V waveform 750 for the MEMS device employing the digital actuator of FIG. 4 are again shown, together with a Qclk waveform 760 and a phase and frequency check waveform 770 consistent with the closed loop mode of operation. Frequency check waveform 770 is the signal at the output of the phase frequency detector and, in some examples, may be used to change the sign, e.g. make the low step positive and the high step negative. In a closed loop example, when the frequency and phase of the C2V converter output waveform 750 is known, and when the frequency of the Qclk waveform 760, say MEMS (Q) clock 458 of FIG. 4, is close to the natural (resonance) frequency (Fd) of the proof mass of the MEMS, and the phase shift waveform 770 between the drive actuation signal 700 and the C2V converter output is close to 90°, as in 710, the frequency sweep may be placed on hold so that the drive actuation signal 700 is maintained at a maximum energy transfer. When employing such a closed loop frequency sweep kick operation, the start-up time may be of the order of ~41% less than the start-up time of the MEMS device of FIG. 1, as illustrated in FIG. 2.

Figure 8:
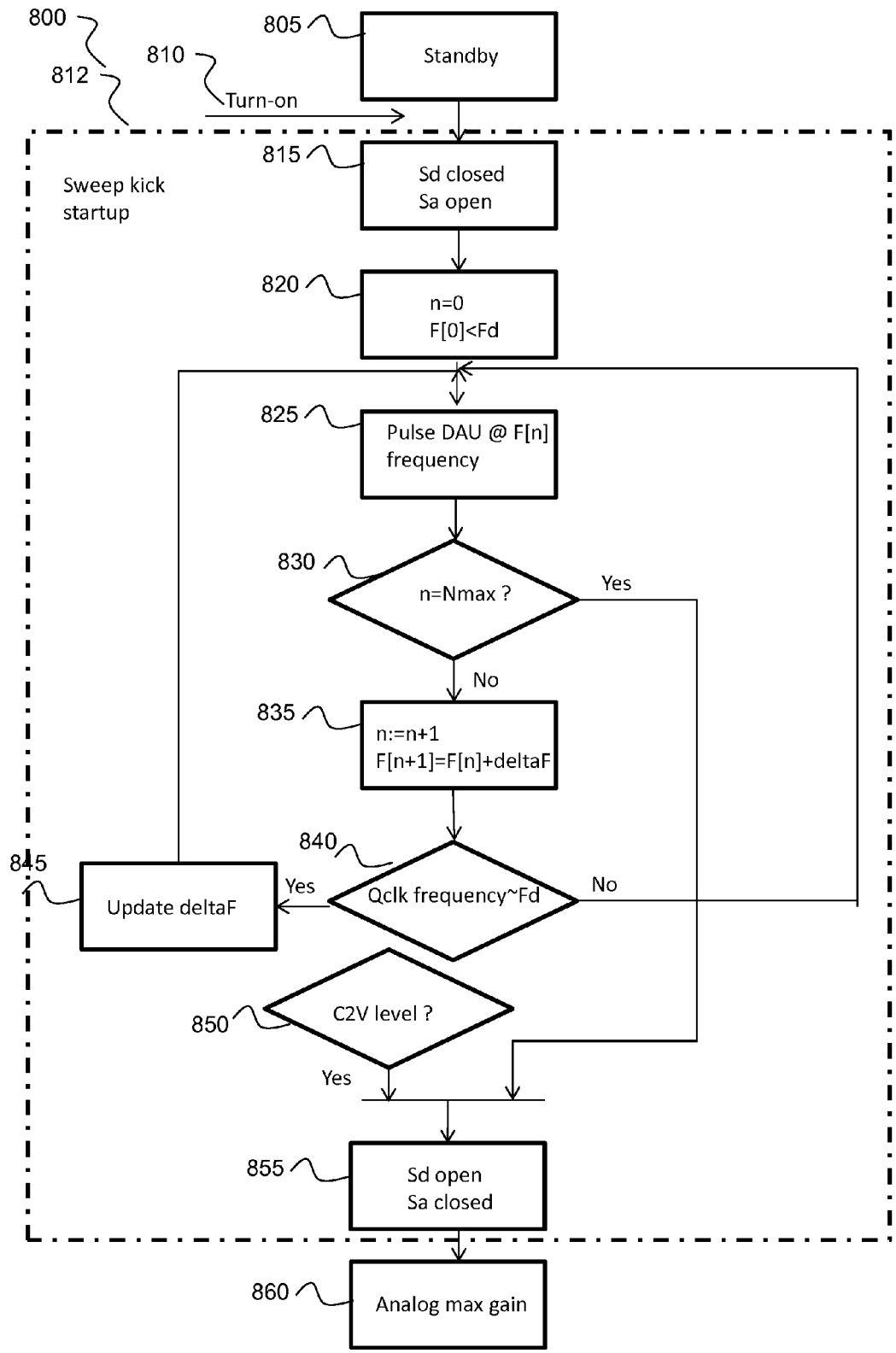
FIG. 8 illustrates a simplified flowchart of an example of a method of generating and applying a proof mass kick within a micro-electro-mechanical system (MEMS) device.

FIG. 8 illustrates a simplified flowchart 800 of an example of a method of generating and applying a proof mass kick within a micro-electro-mechanical system (MEMS) device, for example using a digital actuator in an open loop mode and closed loop mode of operation. The flowchart 800 shows the MEMS device initially operating in a standby mode of operation 805. Following turn-on at 810, the MEMS device switches to a sweep kick start-up mode of operation 812. In this open loop mode of operation, for example, switches Sd 432, 434 are closed and switch Sa 422 opened from the circuit in FIG. 4, as illustrated at 815. A step counter (n) is then started and the sweep frequency set to an initial frequency (F[0]), for example a hard-coded frequency, less than a desired natural frequency of the MEMS proof mass (Fd), at 820. An actuation signal is then generated to drive a drive actuation unit (DAU) of the MEMS device to cause the proof-mass to oscillate at 825.

A determination is then made as to whether the step counter (n) has reached a maximum value (n=Nmax?), at 830. If the step counter (n) has reached a maximum value (n=Nmax?), at 830, the process jumps to 855.

If the step counter (n) has not reached a maximum value (n=Nmax?), at 830, the step counter is incremented (n:=n+1) and the frequency adjusted to a new frequency (F[n+1]) according to the frequency sweep (deltaF), (i.e. F[n+1]:=F[n]+deltaF) at 835. A determination is then made as to whether the MEMS clock (Qclk) is approximately the desired natural frequency of the MEMS proof mass (Fd) at 840. If the MEMS clock (Qclk) is not approximately the same as the desired natural frequency of the MEMS proof mass (Fd) at 840, the process loops back to 825, the pulse is continued at 825 and the counter and frequency updated at 835 (if the counter has not reached a maximum value at 830).

If the MEMS clock (Qclk) is approximately the same as the desired natural frequency of the MEMS proof mass (Fd) at 840, the deltaF value may be updated at 845. In one example, the deltaF update may be set to zero, resulting in no subsequent increment of the frequency at 835, e.g. F[n+1]=F[n]. The process then loops back to 825 until the step counter maximum threshold is reached.

Concurrently, at 850, a determination may be made as to whether the C2V level is correct. If a determination is made that the C2V level is not correct at 850, the process loops. Once a determination is made that the C2V level is correct at 850, and that the step counter (n) has reached a maximum value (n=Nmax?), at 830, then the flowchart switches to a normal active mode of operation, for example, with switches Sd 432, 434 opened and switch Sa 422 closed from the circuit in FIG. 4, as illustrated at 855. Thereafter, the MEMS device may operate with a substantially maximum gain, at 860

Thus, an example of a MEMS device employing a digital actuator has been described that generates and provides to the proof-mass of the MEMS device an open loop frequency sweep of pulses around its natural frequency, for example following an idle time. Such an approach provides a frequency kick upon turn on of the proof-mass of the MEMS device and may significantly reduce a start-up time. An open loop mode of operation may be subsequently replaced by a closed loop mode of operation with a further frequency sweep of pulses around the natural resonance frequency of the proof mass, thereby further reducing the start-up time.

Furthermore, some examples provide a fully digital solution to reducing a start-up time of a mechanical resonator and advantageously do not require any phase locked loop or voltage controlled oscillator-type circuitry.

Thus, some examples provide an ability to monitor a phase and frequency of the MEMS proof-mass from the generated digital stream of pulses. The MEMS device may change (increase or decrease and/or change the sign) of the incremental step according to the phase, the frequency or a combination of both. In this manner, increases or decreases and/or changes in the sign may encompass the closed loop adjustment adding or subtracting (based on the sign) a value to the frequency sweep, and, for either of an added or subtracted value, the frequency sweep can be increased or decreased, e.g. a smaller adjustment of the frequency pulse may be added to the open loop user step, thereby indicating that a match is approaching.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on an integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A system comprising:
   a mechanical resonator;
   an analog circuit operably coupled to the mechanical resonator; the analog circuit arranged to receive a mechanical resonator measurement signal and to output a mechanical resonator actuation signal to the mechanical resonator; and
   a digital actuator operably coupled to the analog circuit and configured to provide a frequency sweep of signals to the analog circuit that induces movement of the mechanical resonator,
   wherein the digital actuator starts the frequency sweep of signals provided to the analog circuit at a frequency higher or lower than a resonant frequency of the mechanical resonator and sweeps the frequency towards and beyond said resonant frequency.

2. The system of claim 1, wherein the digital actuator is configured to provide the frequency sweep of signals to the analog circuit around a natural frequency of the mechanical resonator.

3. The system of claim 1, wherein the frequency sweep of signals provided to the analog circuit comprises a stream of digital pulses close to the resonant frequency of the mechanical resonator.

4. The system of claim 1, wherein the frequency sweep of signals provided to the analog circuit provides a kick start to the mechanical resonator from an idle state.

5. The system of claim 1, wherein the frequency sweep of signals provided to the analog circuit provides a digital kick start of the mechanical resonator.

6. The system of claim 1, wherein the digital actuator is arranged to generate a frequency sweep of signals at least initially in an open loop manner.

7. The system of claim 6, wherein the digital actuator comprises an accumulator arranged to accumulate a frequency step size of digital pulses in generating the frequency sweep of signals.

8. The system of claim 7, wherein the frequency step size is configurable.

9. The system of claim 8 wherein the frequency step size is configured to be zero when the digital actuator determines that the mechanical resonator measurement signal input to the analog circuit is close to the natural frequency of the mechanical resonator.

10. The system of claim 7 wherein the digital actuator comprises a kick clock period counter operably coupled to the accumulator and arranged to limit a number of digital pulses generated in the open loop manner.

11. The system of claim 6, wherein a continued frequency sweep of signals is generated in a closed loop manner.

12. The system of claim 11, wherein the digital actuator further comprises a clock period counter arranged to receive and measure a duration of a mechanical resonator clock signal output by the analog circuit.

13. The system of claim 7, wherein the digital actuator further comprises a phase and frequency detector operably coupled to a clock period counter and a kick clock period counter operably coupled to the accumulator and arranged to compare a frequency and phase output of the clock period counter and the kick clock period counter.

14. The system of claim 13, wherein the digital actuator further comprises a phase and frequency modulator operably coupled to the phase and frequency detector and arranged to perform at least one from a group of:
   update the frequency step size;
   update a sign associated with the frequency step size;
   stop the frequency sweep when the frequency and phase output of the clock period counter and the kick clock period counter match.

15. The system of claim 14 wherein the frequency step size is an integer number of a digital master clock period and a fractional number of the mechanical resonator frequency.

16. The system of claim 1 wherein the system comprises a micro-electro-mechanical system device.

17. The system of claim 16 wherein the system is a vibrating gyroscope and the mechanical resonator is a proof-mass.

18. An integrated circuit comprising at least one die within a single integrated circuit package, wherein the integrated circuit comprises the digital actuator according to claim 1.

19. A method of generating an actuation signal for a mechanical resonator within an micro-electro-mechanical system (MEMS) device, the method comprising:
   turning on the MEMS device;
   receiving a mechanical resonator measurement signal at an analog circuit operably coupled to the mechanical resonator;
   outputting a mechanical resonator actuation signal to the mechanical resonator with the analog circuit;
   providing a frequency sweep of signals to the analog circuit to act as a kick start actuation signal for the MEMS device in response to the turn on, the frequency sweep of signals provided by a digital actuator operably coupled to the analog circuit, wherein the frequency sweep of signals starts at a frequency higher or lower than a natural frequency of the mechanical resonator and sweeps towards and beyond said natural frequency; and
   inducing movement of the mechanical resonator with the analog circuit in response to the frequency sweep of signals.

* * * * *